United States Patent [19]

Takeuchi

[11] Patent Number: 4,965,768

[45] Date of Patent: Oct. 23, 1990

[54] SEMICONDUCTOR DEVICE HAVING PROGRAMMABLE READ ONLY MEMORY CELLS FOR SPECIFIC MODE

[75] Inventor: Atsushi Takeuchi, Kawasaki, Japan

[73] Assignee: Fujitsu Limited, Kanagawa, Japan

[21] Appl. No.: 130,691

[22] Filed: Dec. 8, 1987

[30] Foreign Application Priority Data

Dec. 20, 1986 [JP] Japan .................................. 61-302811

[51] Int. Cl.$^5$ ................................................ G11C 7/00
[52] U.S. Cl. ........................................ 365/201; 365/94
[58] Field of Search .......................... 365/201, 94, 96; 371/21; 324/158 T

[56] References Cited

U.S. PATENT DOCUMENTS

| | | | |
|---|---|---|---|
| 4,380,805 | 4/1983 | Proebsting | 365/201 |
| 4,658,380 | 4/1987 | Eby | 365/201 |

*Primary Examiner*—Joseph A. Popek
*Attorney, Agent, or Firm*—Armstrong, Nikaido Marmelstein Kubovcik & Murray

[57] ABSTRACT

A semiconductor device having an internal circuit comprising a program circuit for programming a PROM, a discrimination circuit for discriminating the contents of the PROM, and a specific mode starting circuit for bringing the internal circuit to a specific mode when a specific mode starting signal is output from the discrimination circuit. Consequently, the semiconductor device can be brought to the specific mode without the need for special additional equipment.

11 Claims, 8 Drawing Sheets

SEMICONDUCTOR DEVICE HAVING PROGRAMMABLE READ ONLY MEMORY CELLS FOR SPECIFIC MODE

BACKGROUND OF THE INVENTION

1. Field of the Invention

The present invention relates to a semiconductor device having programable read only memory cells for a specific mode, more particularly, to a semiconductor device having a programable read only memory (PROM) for bringing the semiconductor device to a specific mode in accordance with the contents of the PROM.

2. Description of the Related Art

Generally, in order to bring a semiconductor device to a specific mode, a high potential signal at a level higher than a normal potential signal is applied to a pad of the semiconductor device. The high potential signal is generated by additional special equipment, such as a high potential generator, during manufacture, and thus the semiconductor device is only brought to the specific mode during the manufacture of the semiconductor device, and therefore, the semiconductor device should not be brought to the specific mode while a user is operating the semiconductor device at the normal potential.

Note, problems such as burn-in occur, and further, the manufacturer must provide additional equipment to apply the above described high potential signal to the pad of the semiconductor device for bringing the semiconductor device to the specific mode. These problems in the related art will be later explained in detail.

SUMMARY OF THE INVENTION

It is an object of the present invention to provide a semiconductor device which can be brought to start the specific mode without special additional equipment but will not be brought to the specific mode during a user operation.

According to the present invention, there is provided a semiconductor device having an internal circuit, the semiconductor device comprising pads, a programable read only memory, a program circuit, a discrimination circuit, and a specific mode starting circuit. The program circuit is operatively connected to the pads and the programable read only memory, for programing the programable read only memory in accordance with potentials at the pads of the semiconductor device. The discrimination circuit is operatively connected to the programable read only memory for discriminating the contents of the programable read only memory, and this discrimination circuit outputs a signal for starting a specific mode. The specific mode starting circuit is operatively connected to the discrimination circuit and the internal circuit, and the internal circuit is brought to the specific mode when the specific mode starting circuit receives the specific mode starting signal from the discrimination circuit.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments, the problems of the related art will be first explained.

Figure 1:
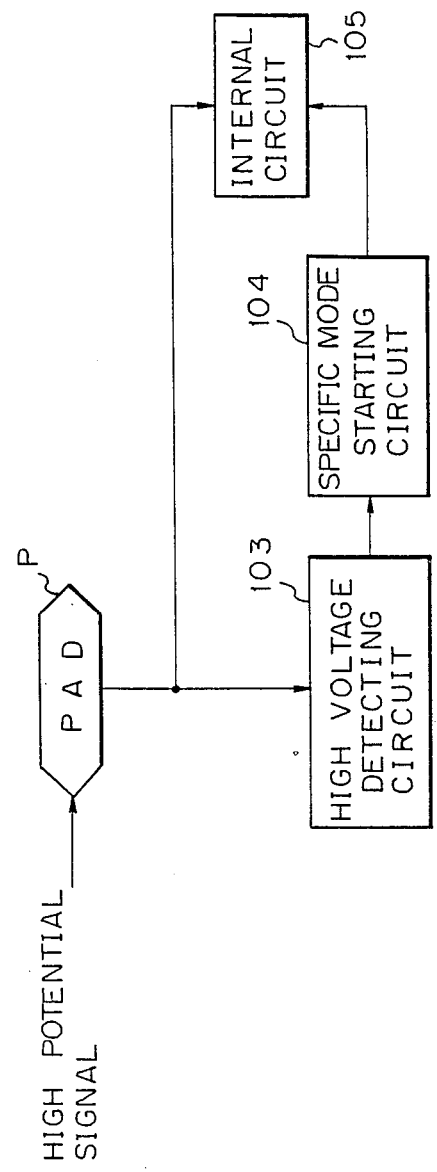
FIG. 1 is a block diagram illustrating a conventional semiconductor device including a test mode starting means.

FIG. 1 is a block diagram illustrating a conventional semiconductor device including a test mode starting means. As shown in FIG. 1, a pad P of a semiconductor device is connected to an internal circuit 105 and a signal from the pad P is transmitted directly to the internal circuit 105. The pad P is also connected to a high voltage detecting circuit 103. When a high potential signal at a level higher than a normal potential signal is applied to the pad P of the semiconductor device, the high voltage detecting circuit 103 generates a starting signal. The starting signal is transmitted to a specific test starting circuit 104, and the specific test starting circuit 104 carries out a specific test on the internal circuit 105. That is, when the high potential signal is applied to the pad P of the semiconductor device, the semiconductor device is subjected to a specific test operation. This high potential signal is generated by additional special equipment, such as a high potential generator, during the manufacture of the semiconductor device, and thus the semiconductor device is brought to the test mode only during the manufacture thereof. Consequently, the test mode should not be started in the semiconductor device while a user is operating the semiconductor device at the normal potential.

Figure 2:
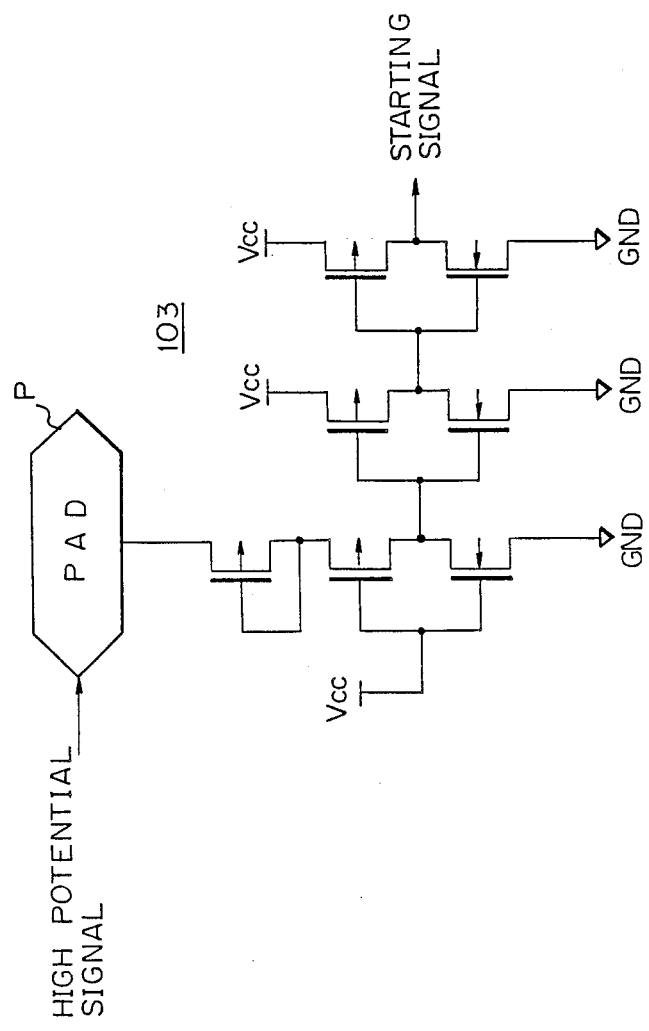
FIG. 2 is a circuit diagram illustrating an example of a part of the conventional semiconductor device shown in FIG. 1.

FIG. 2 is a circuit diagram illustrating an example of a part of the conventional semiconductor device shown in FIG. 1. The high voltage detecting circuit 103 is included in a semiconductor device as in the above description with reference to FIG. 1. When a high potential signal (e.g., 8 volts) for a test mode, at a level higher than a normal potential signal having a predetermined voltage range (e.g., from 0 volts to 5 volts), is applied to a pad P of the semiconductor device, the high voltage detecting circuit generates a starting signal for bringing the semiconductor device to the test mode. In this conventional semiconductor device, the specific test is performed on the semiconductor device only when a high potential signal at a level higher than the normal potential signal is continuously applied to the pad P.

For example, the internal circuit 105 comprises a memory device having a plurality of word lines and the above test mode is a selection of all word lines of the memory device. In this selection of all word lines, a test signal is applied to all of the word lines and a burn-in is performed on the semiconductor device in a short time, since the test signal can be applied to all of the word lines at the same time, and thus all of the cells connected to each of the word lines can be tested in parallel and in a short time. Note, the burn-in includes various operation tests for stabilizing the quality of the semiconductor device and detecting sub-standard devices. Therefore, a burn-in is necessary for the semiconductor device in order to guarantee the operating characteristic of the device. An operating life test of the operation tests carried out by a burn-in is preferably performed under a high temperature, since a defective portion of the semiconductor device is more easily detecting at a high temperature. Consequently, when the burn-in is performed under a high temperature, the operating life test by a burn-in can be quickly completed and the number of necessary samples needed for the test can be reduced, compared to that required for a test at room temperature.

In the conventional semiconductor device, the internal circuit 105 is brought to the all word lines selection state of the specific mode, only when a high potential signal at a level higher than the normal potential signal is applied to the pad P. This high potential signal is generated by the high potential generator, and therefore, the high potential generator must be provided for the apparatus for testing the operating life test by a burn-in, by applying the high potential signal to the pad P of the semiconductor device continuously during the test. But, the additional equipment such as a high potential generator, which can be used at a high temperature for accelerating the operating life test by a burn-in, is difficult for a manufacturer to provide.

Next, a description will be given of the principle of a semiconductor device having programable read only memory cells for a specific mode, according to the present invention.

Figure 3:
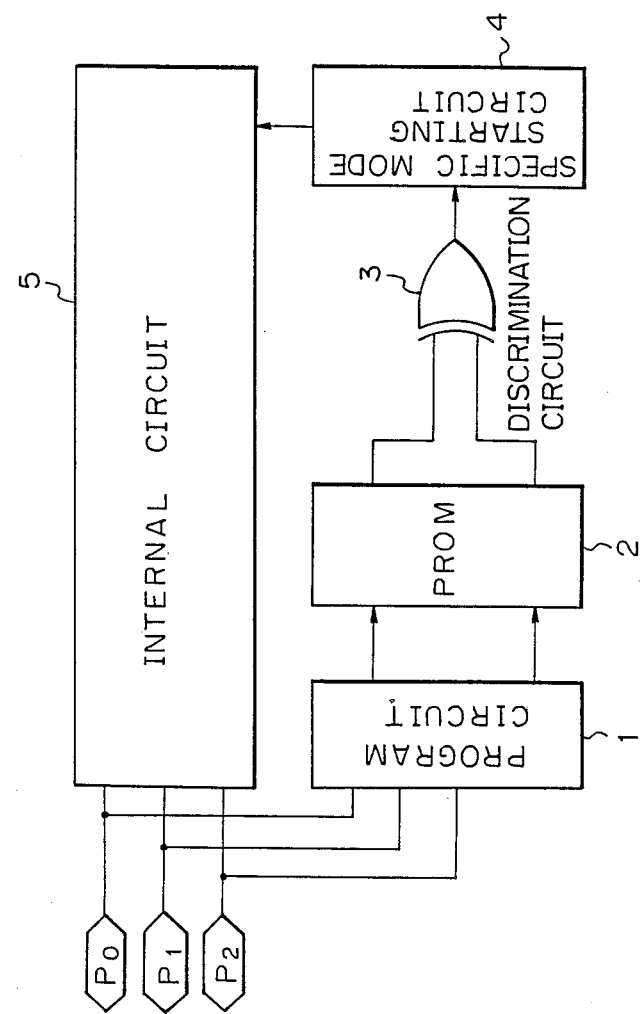
FIG. 3 is a block circuit diagram illustrating a principle of a semiconductor device having programable read only memory cells for a specific mode, according to the present invention.

FIG. 3 is a block circuit diagram illustrating a principle of a semiconductor device having programable read only memory cells for a specific mode, according to the present invention. As shown in FIG. 3, reference numeral 1 denotes a program circuit, and reference numeral 2 denotes a PROM which is programmed by the program circuit 1. Reference numeral 3 denotes a discrimination circuit for discriminating the contents of the PROM 2, reference numeral 4 denotes a specific mode starting circuit, and reference numeral 5 denotes an internal circuit. The specific mode starting circuit 4 brings the internal circuit 3 to a specific mode, for example, a test mode, in accordance with an output of the discrimination circuit 3. The PROM 2 is programmed as a test mode or a normal mode by the program circuit 1 in accordance with signals from three pads $P_1$, $P_2$, $P_3$ of the semiconductor device. For example, the PROM 2 is programmed as the test mode before performing the operating life test, and the discrimination circuit 3 outputs a starting signal to the specific mode starting circuit 4 by discriminating the contents of the PROM 2. The specific mode starting circuit 4 brings the internal circuit 5 to the test mode when receiving the starting signal from the discrimination circuit 3. In this test mode of the internal circuit 5, for example, an operating life test by a burn-in is performed on the internal circuit 5. After the operating life test, the PROM 2 is programmed to the normal operation mode, and the discrimination circuit 3 does not output a starting signal to the specific mode starting circuit 4 by discriminating the contents of the PROM 2. Therefore, the internal circuit 5 is returned to the normal mode and the semiconductor device is made available to the user.

Figure 4A:
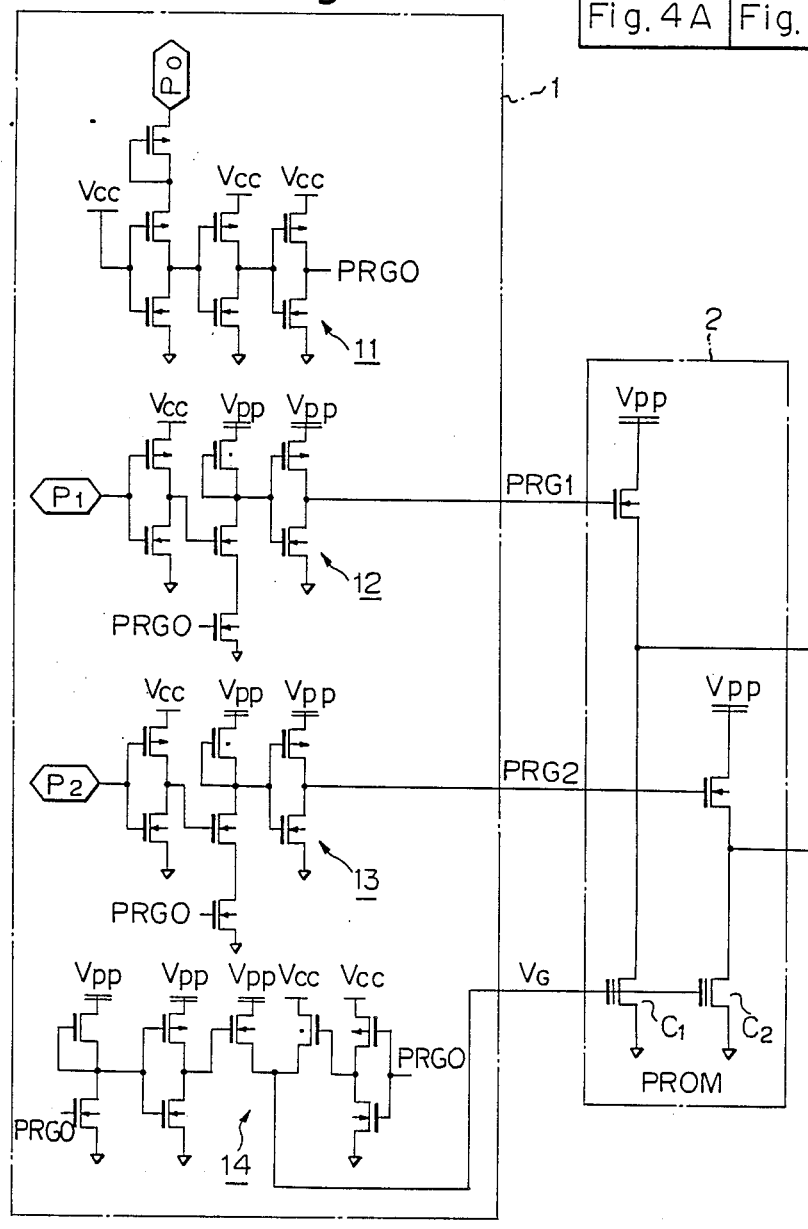
FIGS. 4A and 4B are connected portions of a circuit diagram shown in FIG. 4 illustrating a preferred embodiment of a semiconductor device according to the present invention.
Figure 4B:
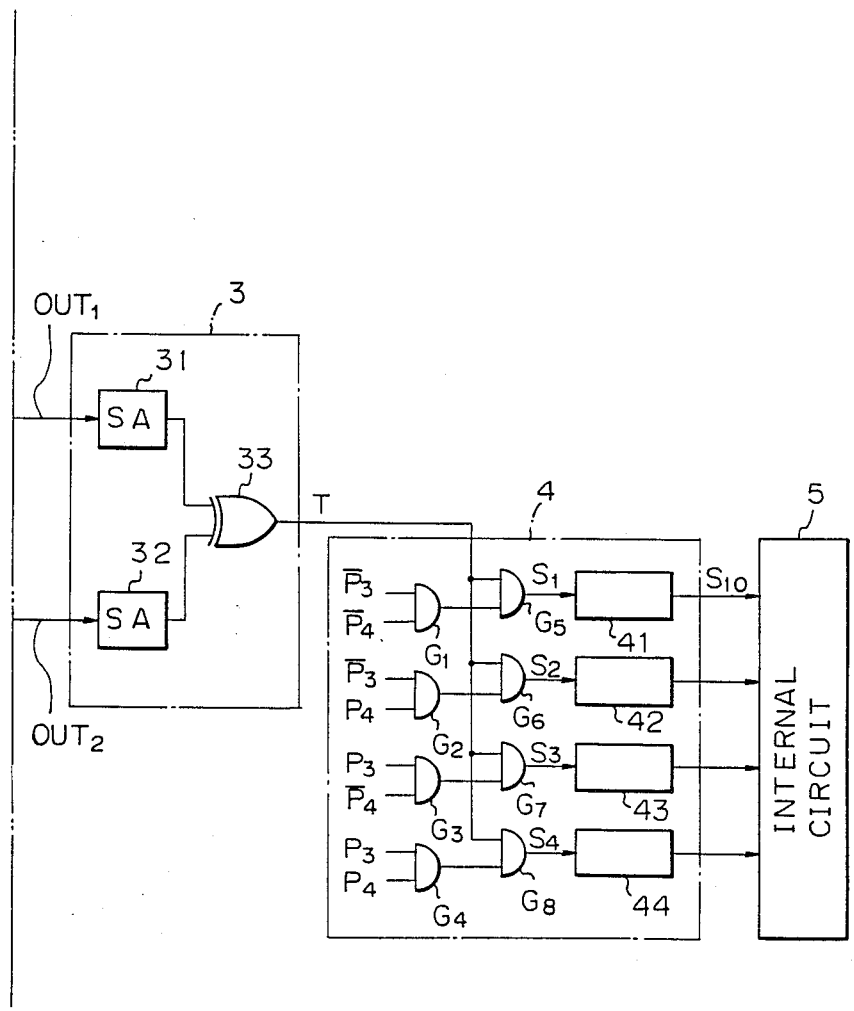

FIG. 4 is a circuit diagram illustrating a preferred embodiment of a semiconductor device according to the present invention. In FIG. 4, reference numeral 2 denotes a 2 bits PROM which is programmed by the program circuit 1. In this embodiment, the PROM has, for example, floating gate type erasable programable read only memory (EPROM) cells. Reference numeral 3 denotes a discrimination circuit for discriminating 2 bits of output $OUT_1$, $OUT_2$ of the PROM 2, and reference numeral 4 denotes a specific mode starting circuit for bringing an internal circuit 5 to four kinds of specific modes. Where the internal circuit 5 comprises EPROM cells, the four kinds of modes are, for example, a selection of all word lines and all bit lines of the EPROM cells. Reference $V_{CC}$ and $V_{PP}$ are, for example, 5V and 25V, respectively. In the above description, the 2 bits PROM can use not only the floating gate type erasable programable read only memory cells, but also, for example, electrically alterable read only memory cells and fuse read only memory cells.

The program circuit 1 comprises four circuits 11, 12, 13, 14. The circuit 11 generates a program signal PRG0 in accordance with a potential of a pad $P_0$. In this case, a logical relationship between the potential of the pad $P_0$ and the potential of the program signal PRG0 is as follows:

| $P_0$ | PRG0 |
| --- | --- |
| HH ($\gg V_{CC}$) | H |
| L | L |

Further, the circuit 12 generates a first program signal PRG1 in accordance with the potentials of the program signal PRG0 and a pad $P_1$, and in this case, the potential of the program signal PRG1 is as follows:

| PRG0 | $P_1$ | PRG1 |
| --- | --- | --- |
| H | H | L |
| H | L | H ($= V_{pp}$) |
| L | H | L |
| L | L | L |

Similarly, the circuit 13 generates a second program signal PRG2 in accordance with the potentials of the program signal PRG0 and a pad $P_2$, and in this case, the potential of the program signal PRG2 is as follows:

| PRG0 | $P_2$ | PRG2 |
| --- | --- | --- |
| H | H | L |
| H | L | H ($= V_{pp}$) |
| L | H | L |
| L | L | L |

Furthermore, the circuit 14 generates a gate voltage $V_G$ at cells $C_1$, $C_2$ in the PROM 2 in accordance with the potentials of the program signal PRG0, and in this case:

| PRG0 | $V_G$ |
|---|---|
| H | H ($\sim V_{pp}$) |
| L | H ($= V_{CC}$) |

Consequently, in the PROM 2, when the potential of the pad $P_0$ is at the high level (HH) and the potential of the pad $P_1$ is at the low level (L), the cell $C_1$ is programmed, and when the potential of the pad $P_0$ is at the high level (HH) and the potential of the pad $P_2$ is at the low level (L), the cell $C_2$ is programmed. In this embodiment, the cells $C_1$, $C_2$ are not programmed at the initial state, and therefore, both outputs $OUT_1$, $OUT_2$ of the PROM 2 are at the low level. When performing a test such as an operating life test by a burn-in, the outputs $OUT_1$, $OUT_2$ of the PROM 2 are at the high level and low level, respectively, because the potential of the pad $P_0$ is at the high level (HH) and the potential of the pad $P_2$ is at the low level (L), and thus the cell $C_1$ is programmed. Moreover, when the test operation outputs $OUT_1$, $OUT_2$ of the PROM 2 are at the high level, because the potential of the pad $P_0$ is at the high level (HH) and the potential of the pad $P_2$ is at the low level (L), and thus the cell $C_2$ is programmed.

The discrimination circuit 3 generates a test mode starting signal T by detecting a discrepancy between the $OUT_1$, $OUT_2$ of the PROM 2. Therefore, the discrimination circuit 3 comprises sense circuits 31, 32 for sensing each output $OUT_1$, $OUT_2$ of the PROM 2, and an exclusive OR circuit 33. That is, the exclusive OR circuit 33 generates a high level signal, which is the test instruction signal T, only when the two outputs $OUT_1$, $OUT_2$ of the PROM 2 have a discrepancy therebetween.

The specific mode starting circuit 4 includes a plurality of AND circuits $G_1 \sim G_8$ and a plurality of specific mode circuits 41, 42, 43, 44 in accordance with the potentials of the pads $P_3$, $P_4$. Therefore, while the test mode starting signal T is generated, the specific mode starting circuit 4 brings the internal circuit 5 to the specific mode of the specific mode circuits 41, 42, 43, 44, in accordance with the potentials of the pads $P_3$, $P_4$. When both potentials of the pads $P_3$, $P_4$ are at the low level, the internal circuit 5 is brought to the specific mode of the specific mode circuit 41, for example, the selection of all word lines. Namely, a signal $S_{10}$ of the specific mode circuit 41 is output to the internal circuit 5 and the internal circuit 5 is brought to the all word lines selection state. When the potential of the pad $P_3$ is at the low level and the potential of the pad $P_4$ is at the high level, the internal circuit 5 is brought to the specific mode of the specific mode circuit 42, for example, the all bit lines selection state.

Figure 5A:
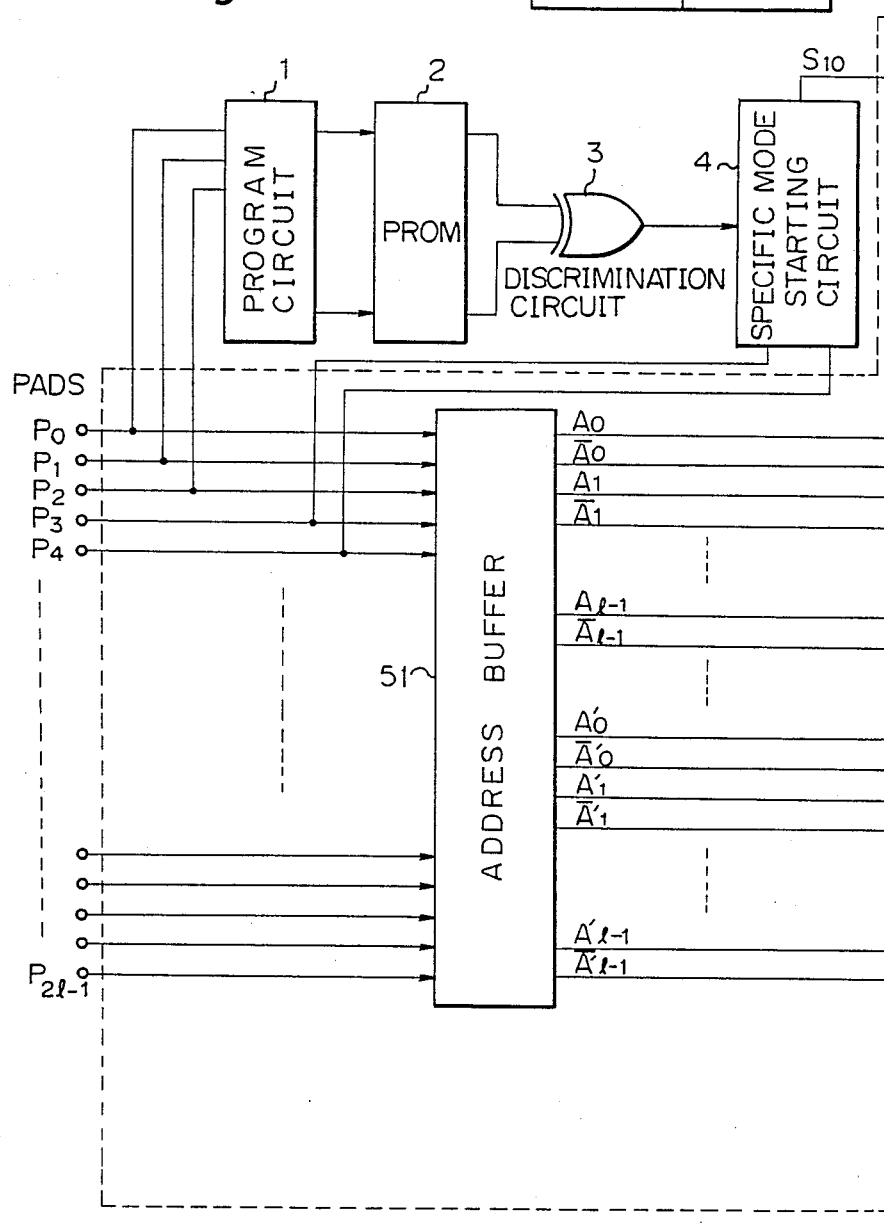
FIGS. 5A and 5B are connected portions of a block circuit diagram shown in FIG. 5 illustrating an EPROM to which an example of specific modes is brought.
Figure 5B:
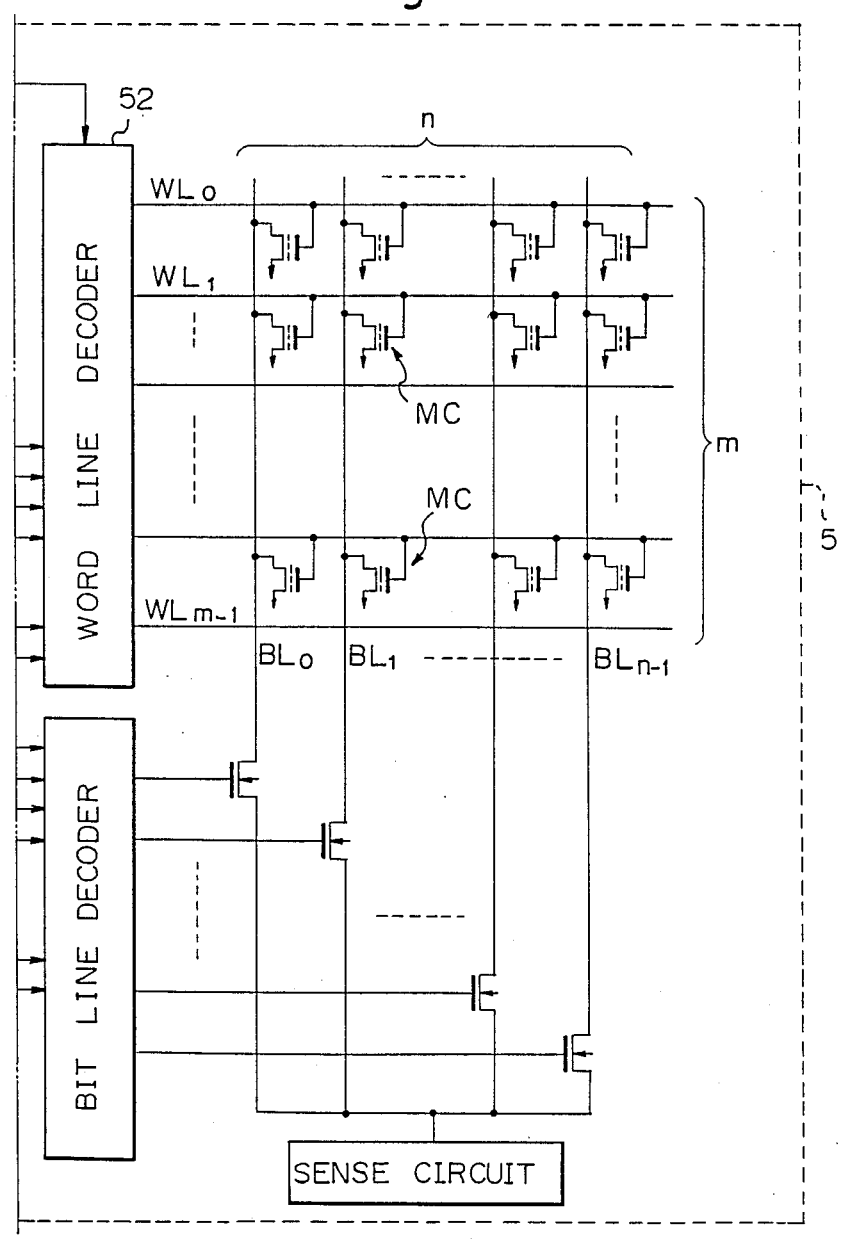

FIG. 5 is a block circuit diagram illustrating an EPROM to which an example of specific modes is brought. In FIG. 5, the semiconductor device including the EPROM circuit, which is an example of the internal circuit 5, has a plurality of pads $P_0 \sim P_{2l-1}$ connected to an address buffer 51 of the EPROM circuit 5. The semiconductor device selects all word lines $WL_0 \sim WL_{m-1}$ of the EPROM circuit 5 for testing all memory cells of the EPROM circuit 5 at the same time. The selection of all word lines is made when both potentials of the pads $P_3$, $P_4$ are at the low level while the test mode starting signal T is generated. As described above with reference to FIG. 4, the pads $P_1$, $P_2$, $P_3$ are connected to the program circuit 1 and the pads $P_3$, $P_4$ are connected to the specific mode starting circuit. When an output signal $S_{10}$ of the specific mode starting circuit 4 is output to a word line decoder 52 of the EPROM circuit 5, the EPROM circuit 5 is brought to the all word lines $WL_0 \sim WL_{m-1}$ selection state.

Figure 6:
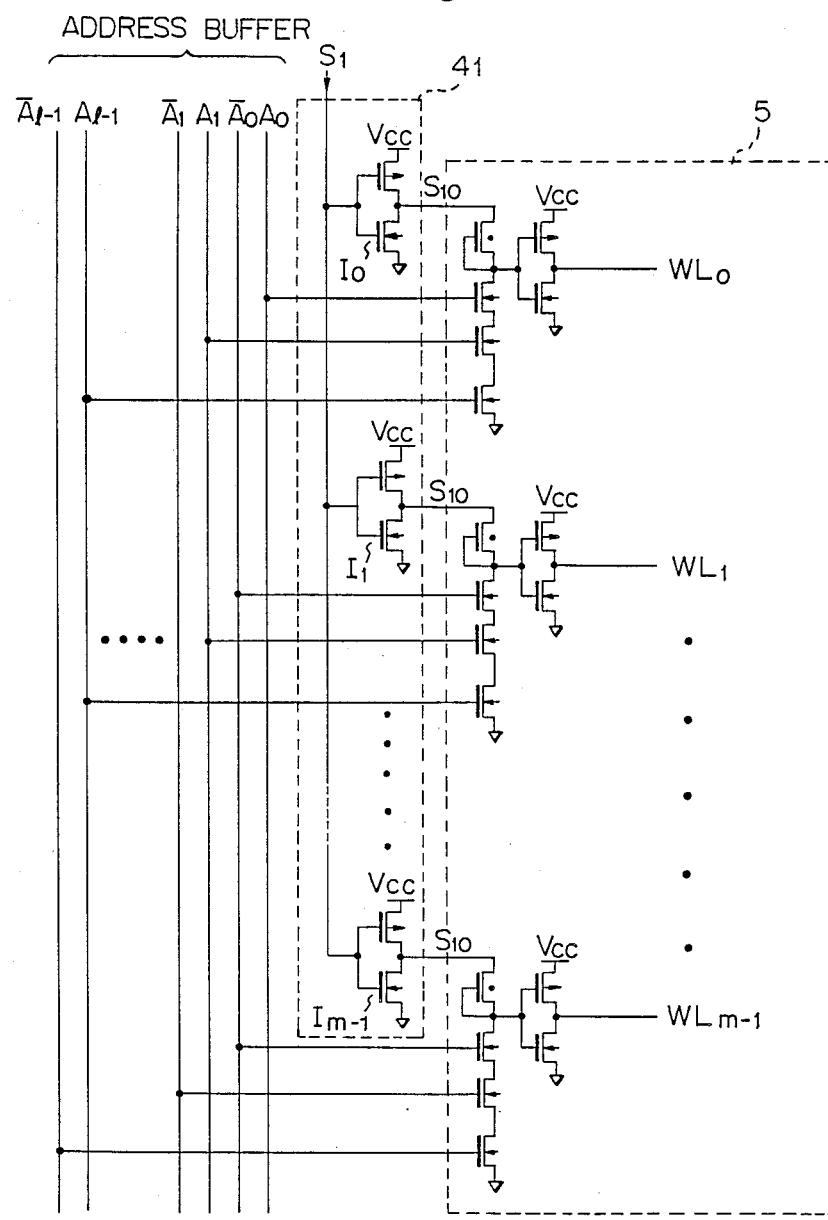
FIG. 6 is a circuit diagram for explaining a specific mode of the EPROM shown in FIG. 5.

FIG. 6 is a circuit diagram for explaining a specific mode of the EPROM shown in FIG. 5. As shown in FIG. 6, an example of the specific mode is a selection of all word lines $WL_0 \sim WL_{m-1}$ of the memory cells. When the signal $S_1$ is at the high level, each output signal $S_{10}$ of all inverter circuits $I_0 \sim I_{m-1}$ of the specific mode circuit 41 is at the low level, and all of the word lines $WL_0 \sim WL_{m-1}$ are at the high level, which is the selection state without the contents of signals $A_0$, $\overline{A_0}$, ... $A_{l-1}$, $\overline{A_{l-1}}$, i.e., the EPROM circuit 5 is brought to the all word lines $WL_0 \sim WL_{m-1}$ selection state by the signal $S_{10}$ from the specific mode starting circuit 4. In the above description, when the specific mode is a selection of all bit lines $BL_0 \sim BL_{n-1}$, the specific circuit 42 has the same configuration as the specific mode circuit 41.

In the above embodiment, the pads $P_0 \sim P_4$ connected to the program circuit 1 and the specific mode starting circuit 4 are used as input or output pads of the internal circuit 5, and the input or output signals applied to the pads are not used at the time of the test. Therefore, special pads for the test cannot be utilized. Additionally, the PROM 2 can be erased by irradiating ultraviolet rays, and thus when returning from the test state to a test termination state, the data stored in the PROM 2 must be erased, but it is difficult to erase the data stored in the PROM 2 after packaging in an IC, since ultraviolet rays should not be irradiated to such a packaged IC. In case of the EPROM is an IC having a window for erasing stored data of the packaged IC, the stored data can be erased. If the ultraviolet rays are irradiated to the window of the PROM 2, however, the data stored in main memory cells is also erased by the ultraviolet rays, and therefore, it is preferable not to irradiate the ultraviolet rays to the window of the packaged EPROM. Furthermore, when the cells of the PROM 2 are non-erasable cells such as a fuse, the test state should not be returned to the test termination state by erasing. Consequently, the test termination is preferably carried out by programing the two cells $C_1$, $C_2$ as described in the above embodiment. In this embodiment, the PROM 2 is programmed only when the potential of the pad $P_0$ is higher than the potential $V_{CC}$, and therefore, a test cannot be performed during a normal user operation. Additionally, in order to program the PROM 2, it is necessary to apply a high potential to the pad $P_0$, but when the PROM 2 is already programmed, it is not necessary to apply the high potential continuously to the pad $P_0$ for performing the test. Consequently, in order to perform a test by a burn-in, the PROM 2 is programmed before and after the test period by testing with an IC tester, and thus the test can be performed without attaching special additional equipment to the burn-in apparatus.

Many widely different embodiments of the present invention may be constructed without departing from the spirit and scope of the present invention, and it should be understood that the present invention is not limited to the specific embodiments described in this specification, except as defined in the appended claims.

What is claimed:
1. A semiconductor device, comprising:
    a programmable read only memory;

an internal circuit operating under a normal mode and a specific mode corresponding from said programmable read only memory;

terminals;

a program circuit operatively connected to said terminals and said programable read only memory for programing said programable read only memory in accordance with potentials of said terminals; and a discrimination circuit operatively connected to said programable read only memory for discriminating contents of said specific mode from said programmable read only memory, and for outputting a control signal designating said specific mode from said programmable read only memory so that said internal circuit operating under a normal mode is brought to said specific mode in response to said control signal.

2. A semiconductor device as claimed in claim 1, wherein said terminals are operatively connected to said internal circuit as input terminals or output terminals.

3. A semiconductor device as claimed in claim 1, wherein said programable read only memory comprises a two bits cell configuration, and said discrimination circuit outputs said control signal by discriminating a discrepancy between said two bits of data.

4. A semiconductor device as claimed in claim 1, wherein said programable read only memory comprises erasable programable read only memory cells.

5. A semiconductor device as claimed in claim 1, wherein said programable read only memory comprises electrically alterable read only memory cells.

6. A semiconductor device as claimed in claim 1, wherein said programable read only memory comprises fuse read only memory cells.

7. A semiconductor device as claimed in claim 1, wherein said specific mode comprises a plurality of different modes.

8. A semiconductor device as claimed in claim 1, wherein said specific mode comprises a test mode of said internal circuit.

9. A semiconductor device as claimed in claim 1, wherein said internal circuit comprises a memory device having a plurality of word lines, and during said specific mode all word lines are selected.

10. A semiconductor device as claimed in claim 1, wherein said internal circuit comprises a memory device having a plurality of bit lines, and during said specific mode all bit lines are selected.

11. A semiconductor device as claimed in claim 1, wherein said programable read only memory includes a first memory cell and a second memory cell, said internal circuit being brought to said specific mode from said normal mode when said first memory cell is programmed, and said internal circuit being brought to said normal mode from said specific mode when said second memory cell is programmed.

* * * * *